(12) United States Patent
Durvasula

(10) Patent No.: US 8,039,731 B2
(45) Date of Patent: Oct. 18, 2011

(54) PHOTOVOLTAIC CONCENTRATOR FOR SOLAR ENERGY SYSTEM

(75) Inventor: Ravi Shankar Durvasula, Rexford, NY (US)

(73) Assignee: General Electric Company, Schenectady, NY (US)

(\*) Notice: Subject to any disclaimer, the term of this patent is extended or adjusted under 35 U.S.C. 154(b) by 1428 days.

(21) Appl. No.: 11/146,875

(22) Filed: Jun. 6, 2005

(65) Prior Publication Data

US 2006/0272698 A1 Dec. 7, 2006

(51) Int. Cl.
*H01L 31/042* (2006.01)

(52) U.S. Cl. ......... 136/246; 136/251; 136/256; 136/259

(58) Field of Classification Search .................. 136/246, 136/256, 259, 247, 255, 251
See application file for complete search history.

(56) References Cited

U.S. PATENT DOCUMENTS

| | | | |
|---|---|---|---|
| 4,240,692 A * | 12/1980 | Winston | 385/146 |
| 4,291,191 A * | 9/1981 | Dahlberg | 136/246 |
| 5,080,725 A | 1/1992 | Green et al. | 136/256 |
| 5,240,510 A | 8/1993 | Goldade et al. | |
| 5,261,970 A | 11/1993 | Landis et al. | |
| 5,735,966 A * | 4/1998 | Luch | 136/244 |
| 5,782,993 A | 7/1998 | Ponewash et al. | |
| 6,008,449 A * | 12/1999 | Cole | 136/246 |
| 6,020,553 A * | 2/2000 | Yogev | 136/246 |
| 6,107,564 A * | 8/2000 | Aguilera et al. | 136/257 |
| 6,294,723 B2 * | 9/2001 | Uematsu et al. | 136/246 |
| 6,323,415 B1 * | 11/2001 | Uematsu et al. | 136/246 |
| 6,528,718 B2 * | 3/2003 | Yoda et al. | 136/251 |
| 6,700,054 B2 | 3/2004 | Cherney et al. | 136/246 |
| 2004/0035460 A1 * | 2/2004 | Gonsiorawski | 136/251 |
| 2004/0084077 A1 | 5/2004 | Aylaian | 136/246 |
| 2004/0246605 A1 | 12/2004 | Stiles et al. | 359/857 |

FOREIGN PATENT DOCUMENTS

EP 0029721 6/1981

\* cited by examiner

*Primary Examiner* — Basia Ridley
*Assistant Examiner* — Thanh-Truc Trinh
(74) *Attorney, Agent, or Firm* — Fletcher Yoder

(57) ABSTRACT

The energy conversion system includes a first optical cover having a flat surface and a patterned surface. The patterned surface is configured to receive solar energy from the flat surface, then concentrate and guide the solar energy. The system also includes a second optical cover. The system further includes providing a photovoltaic cell layer between the patterned surface of the first optical cover and the second optical cover. The photovoltaic cell layer is configured to receive the solar energy from the patterned surface and convert the solar energy into electrical energy.

17 Claims, 13 Drawing Sheets

US 8,039,731 B2

PHOTOVOLTAIC CONCENTRATOR FOR SOLAR ENERGY SYSTEM

BACKGROUND

The invention relates generally to a solar energy conversion system, and more particularly, to a photovoltaic concentrator configured to concentrate and guide incident light onto plurality of photovoltaic cells.

Solar energy is considered as an alternate source of energy relative to other forms of energy. Solar energy conversion systems are used to convert solar energy into electrical energy. The solar energy conversion system typically includes photovoltaic modules, photoelectric cells, or solar cells that convert solar energy into electrical energy for immediate use or for storage and subsequent use. Conversion of solar energy into electrical energy includes reception of light, such as sunlight, at a solar cell, absorption of sunlight into the solar cell, generation and separation of positive and negative charges creating a voltage in the solar cell, and collection and transfer of electrical charges through a terminal coupled to the solar cell.

Solar modules are primarily used in residential and commercial areas i.e. in areas served by a grid of an electric utility company. The amount of electrical energy generated by the solar module is directly related to the amount of solar energy the cells within a module absorb, which in turn is impacted by the cell efficiency, surface area of cell coverage, and the intensity or brightness of the sunlight that is incident on the cells. Cost of the photovoltaic module increases with increased surface area coverage by the photovoltaic cells. One approach for reducing the cost associated with photovoltaic modules is via optical concentration techniques. By employing optical concentration, the cell coverage area within the laminate is reduced. Traditional optical concentrators used for higher levels of optical concentration are often bulky and require active tracking of the light rays. Moreover cost associated with traditional optical concentrators are higher.

Therefore, it would be advantageous to provide a low level static optical concentrator for reducing the cost associated with solar modules with minimal efficiency loss.

BRIEF DESCRIPTION

In accordance with one aspect of the present technique, an energy conversion system is provided. The system includes a first optical cover having a flat surface and a patterned surface. The patterned surface is configured to receive solar energy from the flat surface, then concentrate and guide the solar energy. The system also includes a second optical cover. The system further includes a photovoltaic cell layer between the patterned surface of the first optical cover and the second optical cover. The photovoltaic cell layer is configured to receive the solar energy from the patterned surface and convert the solar energy into electrical energy.

In accordance with another aspect of the present technique, an energy conversion system is provided. The system includes a first optical cover comprising a first surface and a second surface, wherein the first surface comprises a flat surface and the second surface comprises a patterned surface configured to receive solar energy from the first surface and further configured to concentrate and guide the solar energy. The system also includes a second optical cover comprising a third patterned surface and a fourth flat surface. The system further includes a plurality of bifacial photovoltaic cells located between the patterned surface of the first optical cover and the second optical cover and configured to receive the solar energy from the patterned surface and convert the solar energy into electrical energy. The solar energy incident on the photovoltaic cells is directly transmitted through the first optical cover, or is transmitted by reflection or total internal reflection of the first optical cover, or is transmitted by total internal reflection of the second optical cover, or a combination thereof.

In accordance with another aspect of the present technique, a solar concentrator is provided. The solar concentrator includes a flat surface. The solar concentrator also includes a patterned surface including a plurality of mutually coupled or discrete horizontal and vertical triangular troughs or pyramidal structures, or conical structures, or a combination thereof. The solar concentrator further includes a reflective layer formed on the patterned surface.

DRAWINGS

These and other features, aspects, and advantages of the present invention will become better understood when the following detailed description is read with reference to the accompanying drawings in which like characters represent like parts throughout the drawings, wherein.

DETAILED DESCRIPTION

As discussed in detail below, embodiments of the present technique provide an energy conversion system having a solar concentrator configured to receive solar energy and further configured to concentrate and guide the solar energy to a photovoltaic cell layer. The solar concentrator is configured to accept light rays from a broad range of incident flux angles with minimal degradation in performance. Specifically, the solar concentrator comprises a front cover having a patterned surface configured to concentrate and guide the solar energy. In accordance with the present technique, cost per power ratio of the solar concentrator is reduced. Also techniques are disclosed in which solar energy incident on the photovoltaic cell layer is directly transmitted through the above-mentioned solar concentrator or is transmitted by total internal reflection through the solar concentrator or a combination thereof. Various embodiments of these techniques are discussed in further detail below with reference to FIGS. 1-13.

Figure 1:
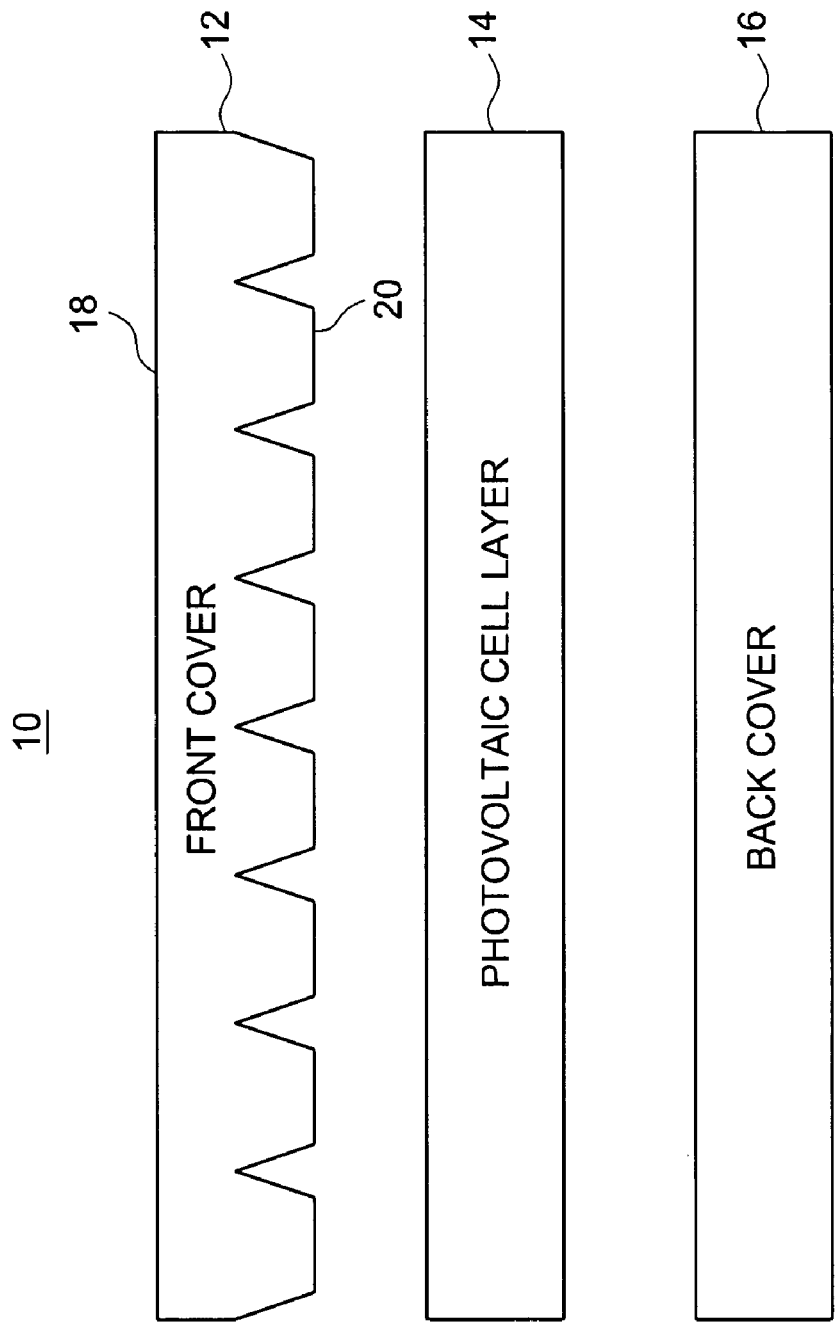
FIG. 1 is a diagrammatic representation of an energy conversion system having a front optical cover, a photovoltaic cell layer, and a back optical cover in accordance with an exemplary embodiment of the present technique.

FIG. 1 illustrates an energy conversion system 10 including a first optical cover 12, a photovoltaic cell layer 14, and a second optical cover 16. In the illustrated embodiment, the first optical cover 12 is illustrated as a front cover and the second optical cover 16 is a back cover. The photovoltaic cell layer 14 is interposed between the front cover 12 and the back cover 16 and may comprise one or more photovoltaic cells.

The front cover 12 may comprise a transparent material, such as glass, polycarbonate, Lexan® material, or the like. The front cover 12 has a first surface 18 and a patterned second surface 20. The photovoltaic cell layer 14 is interposed between the patterned second surface 20 and the back cover 16. The patterned second surface 20 is configured to receive solar energy from the first surface 18 and to concentrate and guide the solar energy to the photovoltaic cell layer 14. The patterned second surface 20 may be formed using existing techniques such as glass molding, fly cutting, or the like as known to those skilled in the art. Further, the front cover 12 may include a single piece of material, as illustrated in FIG. 1, or alternatively, may be a composite structure wherein the first surface 18 and patterned second surface 20 are fabricated separately and subsequently coupled together to form the front cover 12. The structure of the patterned second surface 20 is explained in greater detail below. The photovoltaic cell layer 14 includes semiconductor materials known to those skilled in the art. The photovoltaic cell layer 12 is configured to receive the solar energy from the patterned second surface 20 and convert the solar energy into electrical energy. The back cover 16 may comprise glass, polyvinyl fluoride film, polycarbonate, Noryl®, Lexan® material, or the like. The back cover 16 may be used as an optical cover or as a support plate.

Figure 2:
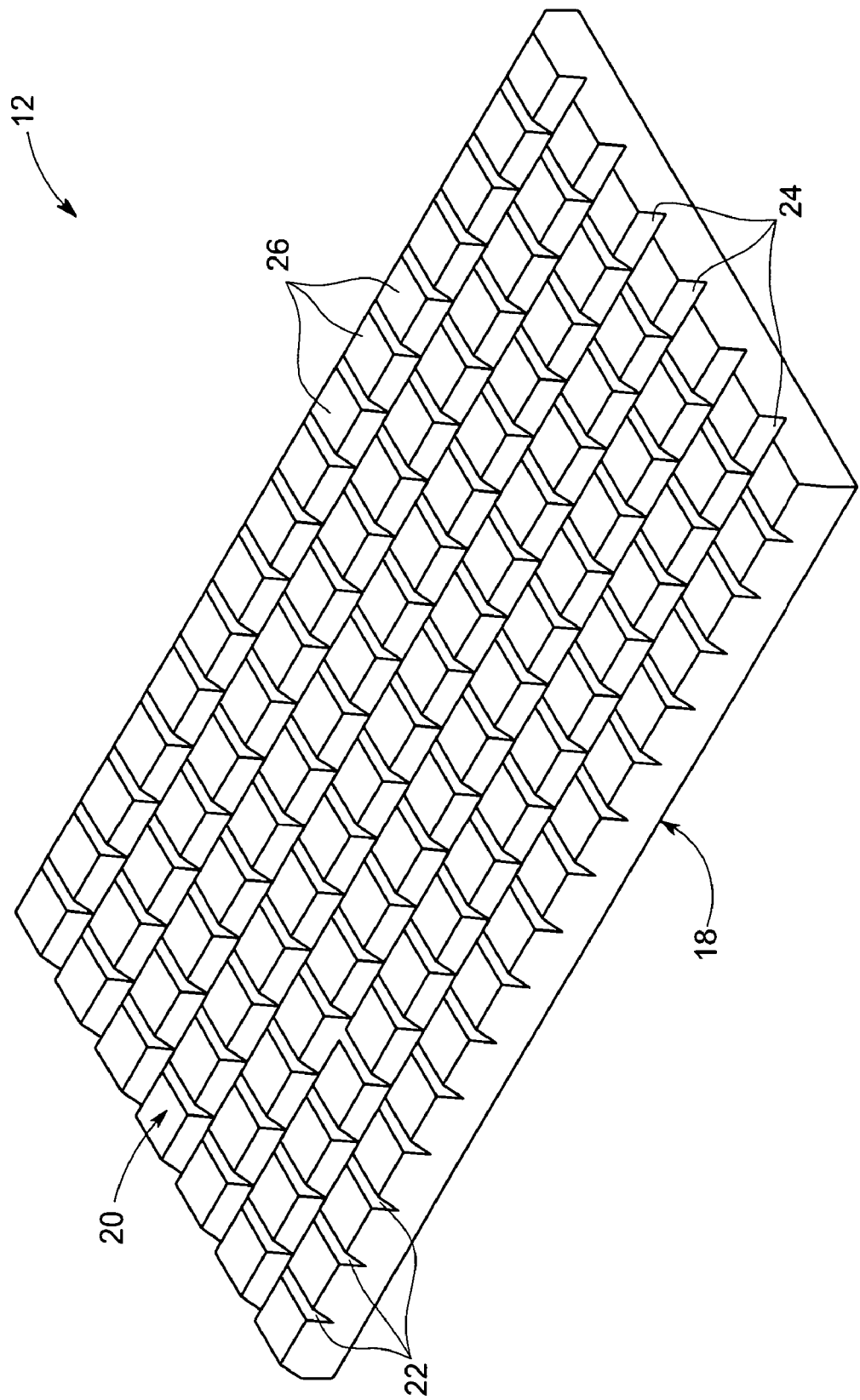
FIG. 2 is a perspective view of the front optical cover having a patterned surface in accordance with an exemplary embodiment of the present technique.

FIG. 2 illustrates the front cover 12 having the patterned second surface 20. In the illustrated embodiment, the patterned second surface 20 includes a plurality of equally spaced horizontal triangular troughs 22 and vertical triangular troughs 24 that extend through the length and width of the front cover 12. The horizontal and vertical triangular troughs 22, 24 intersect to form a plurality of equally spaced rectangular regions 26. The photovoltaic cell layer 14 (illustrated in FIG. 1) may include a plurality of photovoltaic cells and may be positioned directly below the rectangular regions 26 of the patterned second surface 20. The plurality of photovoltaic cells are coupled electrically and may also be embedded in a protective encapsulant (not shown). For example, the protective encapsulant may include ethylene vinyl acetate. The protective encapsulant is configured to provide strength to the photovoltaic cells and also to protect the photovoltaic cells from extreme ambient conditions.

Figure 3:
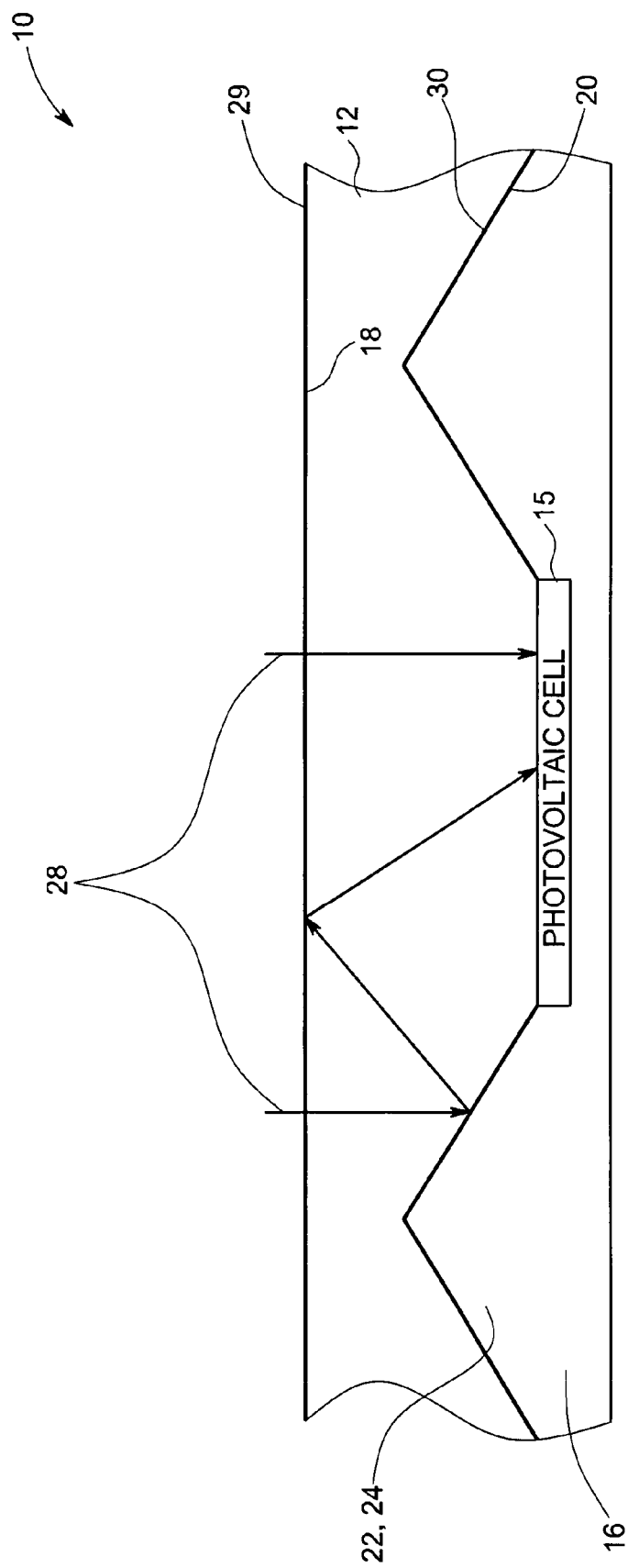
FIG. 3 is a diagrammatical representation illustrating interaction of solar energy in the energy conversion system in accordance with an exemplary embodiment of the present technique.

FIG. 3 illustrates interaction of solar energy in the energy conversion system 10. In the illustrated embodiment, a protective coating 29 is formed on the first surface 18 of the front cover 12 to reject ultraviolet light while transmitting visible light. In one example, the protective coating 29 is comprised of a sollx ® material. The protective coating 29 is provided to selectively reject ultraviolet light from reaching the encapsulant and the photovoltaic cell 15. The protective coating 29 may also be used to block a portion of infrared light from reaching the photovoltaic cell 15 depending on the responsivity of the photovoltaic cell 15. In another embodiment, an ultraviolet absorbing material may be added to material of the front cover 12 instead of or in addition to the protective coating 29. A reflective layer 30 is formed on the patterned second surface 20 of the front cover 12. In one embodiment, the reflective layer 30 includes a metallic coating. In another embodiment, the reflective layer 30 includes a dielectric coating. The reflective layer 30 is configured to reflect the light rays incident on the triangular troughs 22, 24.

In one example, light rays 28 incident on the photovoltaic cell 15, are either directly transmitted through the front cover 12 to the photovoltaic cell 15 or are reflected from the patterned second surface 20 and then reflected from the first surface 18 prior to impinging the photovoltaic cell 15. Light is reflected from the first surface 18 due to total internal reflection (TIR), which occurs when the angle of incidence of light rays in a medium of higher refractive index reaches an interface with a medium of lower refractive index at an angle greater than the critical angle. As known to those skilled in the art, the critical angle is determined based on the difference between the refractive indexes of two mutually adjacent media. In the illustrated embodiment, the angle of incidence of the reflected rays on the first surface 18 is determined based on angle of incidence of the incident solar rays, angle of inclination of the triangular troughs 22, 24, and the refractive index of the material of the front cover 12. The angle of inclination of the triangular troughs is chosen in such a way that so as to optimize the collection efficiency of solar energy for a broad range of incident light rays for a given material.

Figure 4:
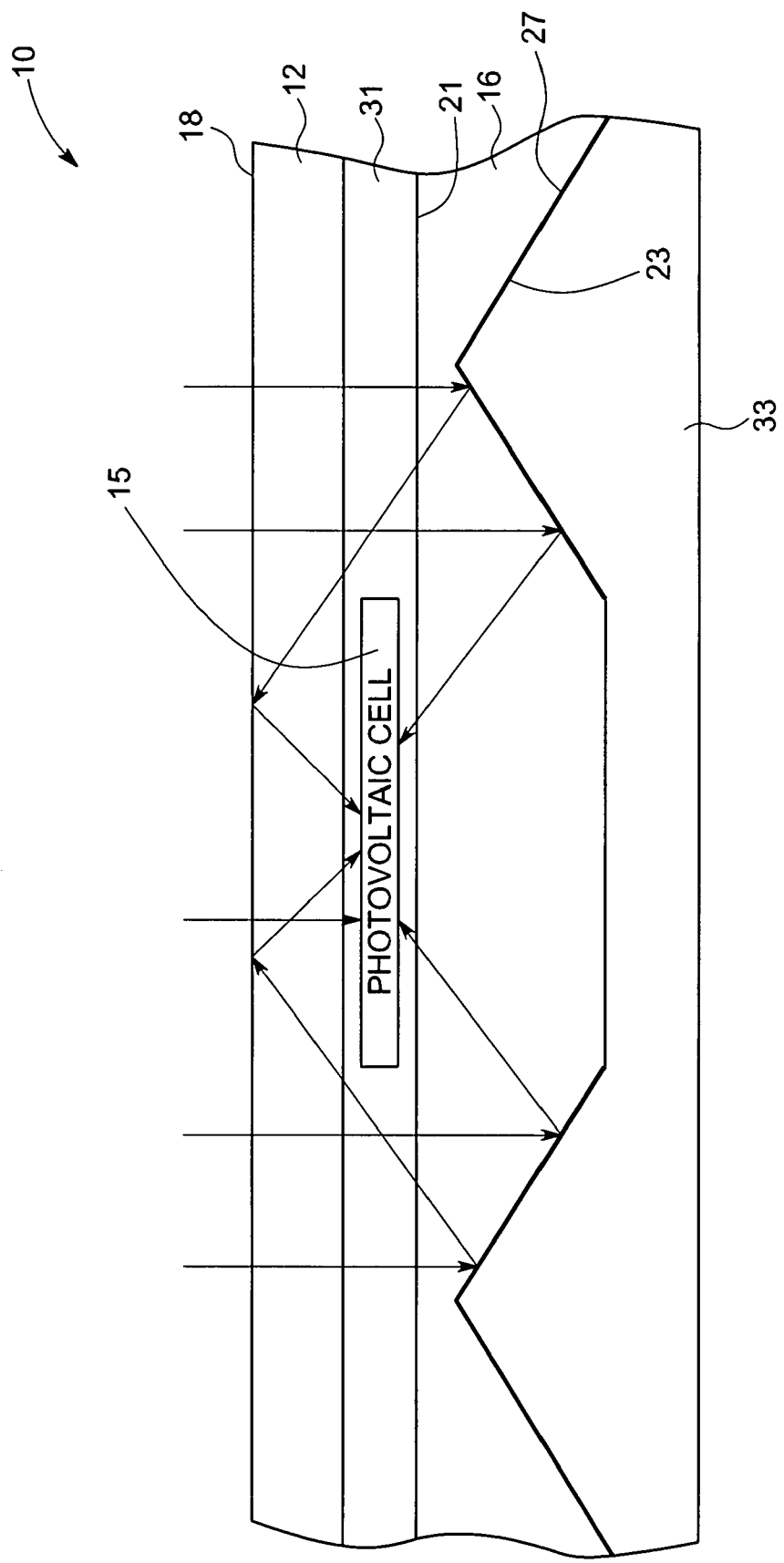
FIG. 4 is a diagrammatical representation illustrating interaction of solar energy in the energy conversion system having a plurality of bifacial photovoltaic cells in accordance with an exemplary embodiment of the present technique.

FIG. 4 illustrates another embodiment of the present invention and illustrates the interaction of solar energy in the energy conversion system 10. In accordance with the embodiment illustrated in FIG. 4, the system 10 includes a plurality of photovoltaic cells 15 provided inside an encapsulant 31 interposed between the front cover 12 and the back cover 16. In the illustrated embodiment, the photovoltaic cell 15 is a bifacial cell as known to those skilled in the art. The back cover 16 includes a flat surface 21 and a patterned surface 23, in accordance with the illustrated embodiment. A reflective layer 27 is formed on the patterned surface 23 of the back cover 16. A support plate 33 (e.g. polyvinyl fluoride plate) may be provided to support the back cover 16. The front cover 12, the back cover 16, and the encapsulant 31 may have similar refractive index.

In illustrated embodiment, light rays incident on the bifacial photovoltaic cell 15, are either directly transmitted through the front cover 12 to the photovoltaic cell 15 or are reflected from the patterned surface 23 of the back cover 16 and then reflected from the first surface 18 of the front cover 12 prior to impinging the bifacial photovoltaic cell 15. As discussed above, light is reflected from the first surface 18 due to total internal reflection (TIR). The light rays reflected from the patterned surface 23 of the back cover 16 may also directly impinge the bifacial photovoltaic cell 15.

Figure 5:
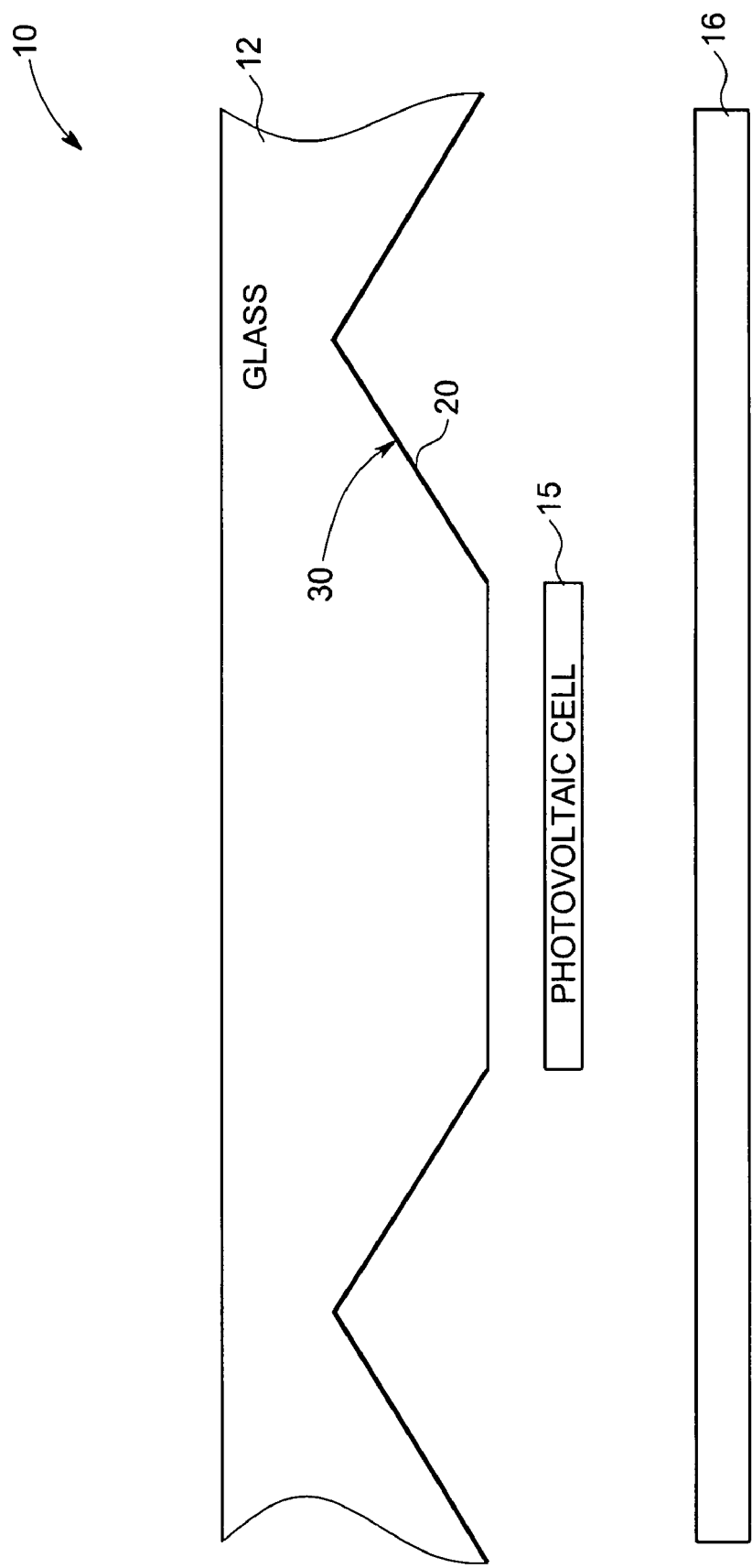
FIG. 5 is a diagrammatical representation of the energy conversion system having plurality of crossed triangular troughs in accordance with certain aspects of the present technique.

FIG. 5 illustrates another embodiment of the energy conversion system 10. In the illustrated embodiment, the front cover 12 comprises glass. As noted above, the reflective layer 30 is formed on the patterned second surface 20 of the front cover 12. The back cover 16 comprises a flat plate. The photovoltaic cell 15 is formed between the patterned second surface 20 and the back cover 16.

Figure 6:
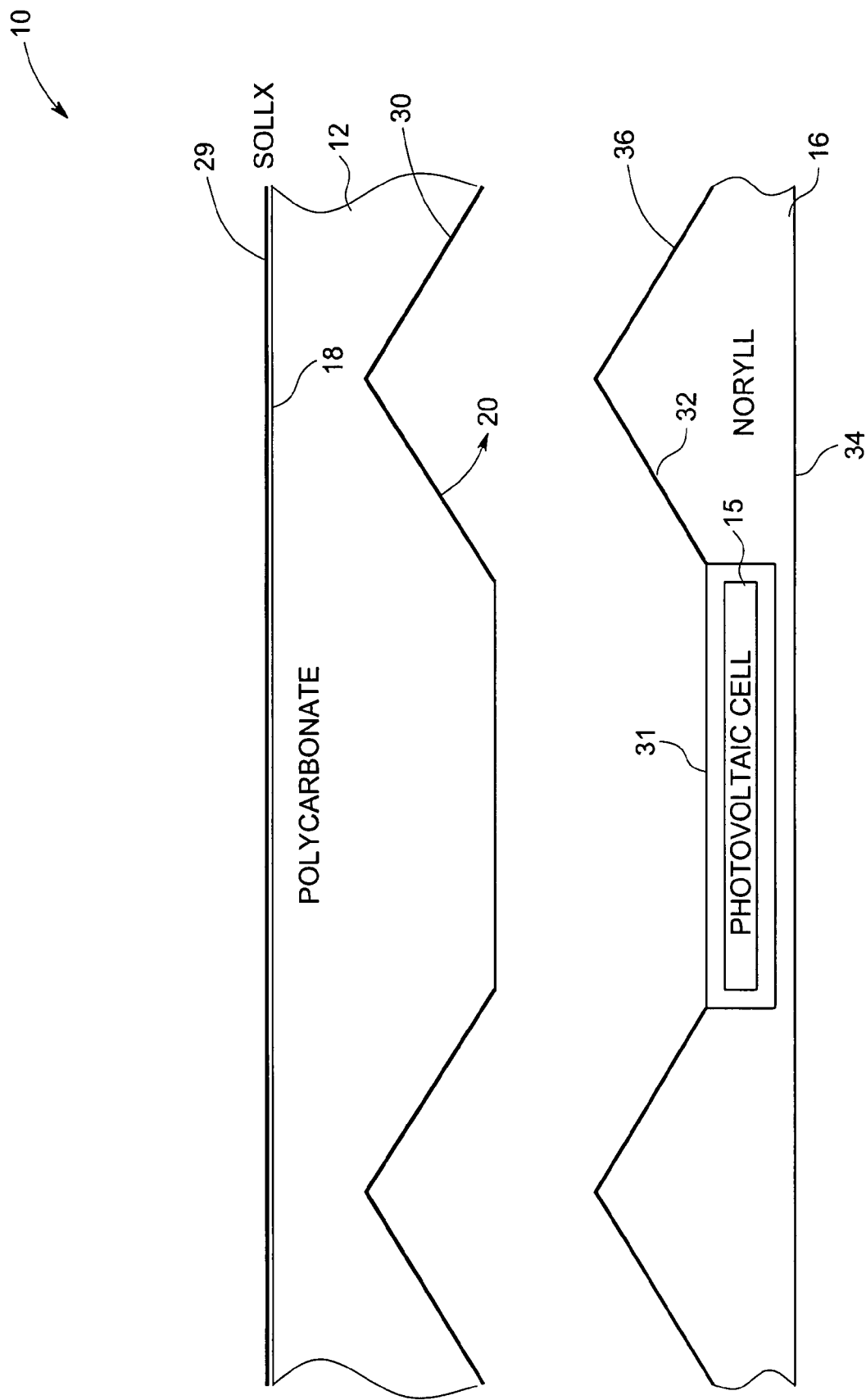
FIG. 6 is a diagrammatical representation of the energy conversion system having a plurality of crossed triangular troughs in accordance with an exemplary embodiment of the present technique.

FIG. 6 illustrates another embodiment of the energy conversion system 10. In the illustrated embodiment, the front cover 12 comprises polycarbonate. As illustrated above, the reflective layer 30 is formed on the patterned second surface 20 of the front cover 12. The back cover 16 comprises Noryl® and has a patterned third surface 32 and a flat fourth surface 34, in accordance with the illustrated embodiment. In the illustrated embodiment, the patterned second surface 20 and the patterned third surface 32 includes the plurality of equally spaced horizontal triangular troughs and vertical triangular troughs. The horizontal and vertical triangular troughs intersect to form the plurality of equally spaced rectangular regions as discussed above. In another example, the patterned second surface 20 and the patterned third surface 32 includes plurality of equally spaced horizontal triangular troughs and vertical triangular troughs, or pyramidal structures, or conical structures, or a combination thereof. Each photovoltaic cell 15 of the photovoltaic cell layer 14 is interposed between the patterned second surface 20 and the patterned third surface 32. The photovoltaic cells 15 may be embedded in the protective encapsulant 31. In the illustrated embodiment, an adhesive coating or an encapsulant 36 is formed on the patterned third surface 32 of the back cover 16.

Figure 7:
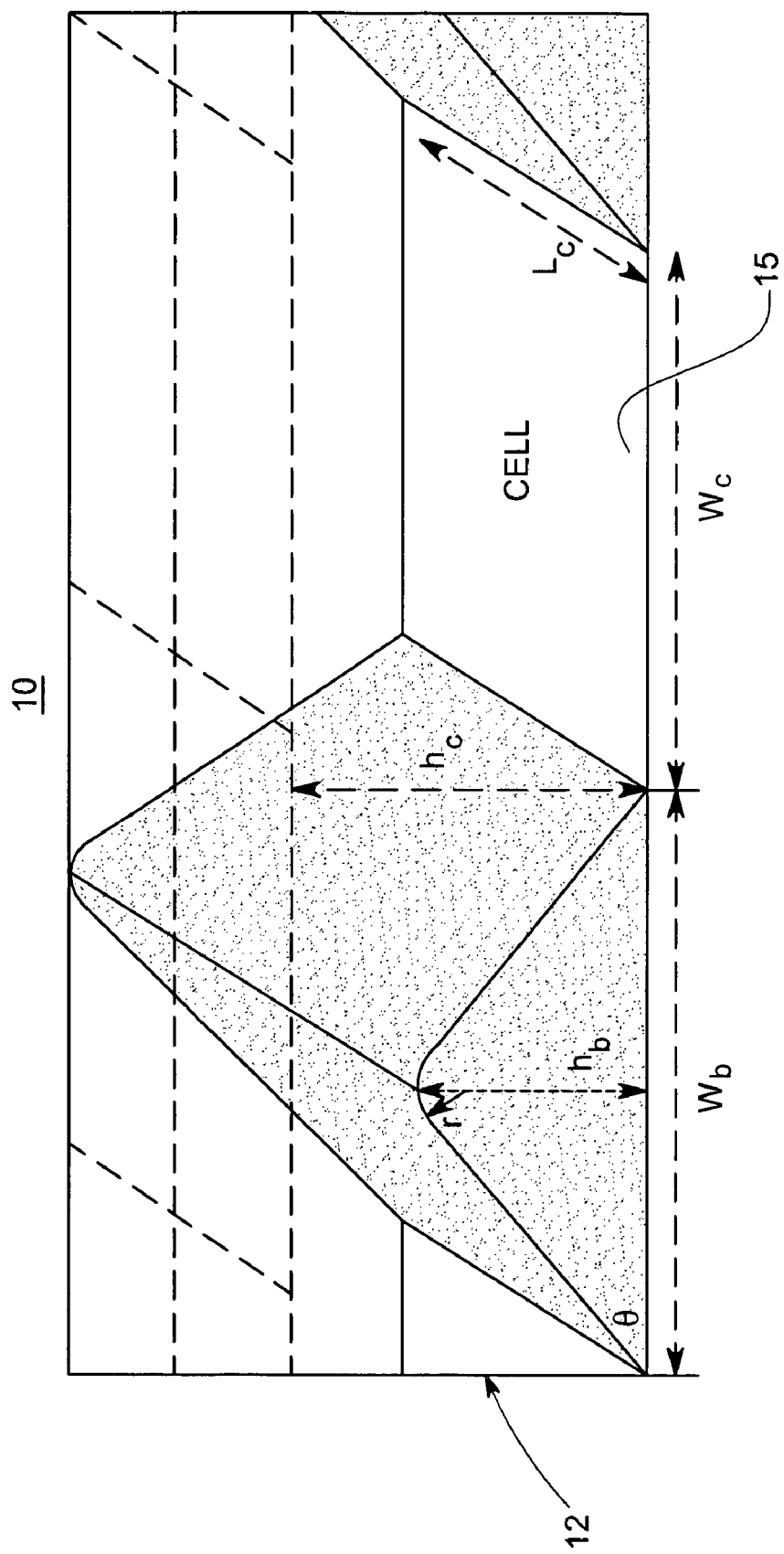
FIG. 7 is a diagrammatical representation of the energy conversion system having plurality of crossed triangular troughs in accordance with certain aspects of the present technique.

FIG. 7 illustrates another embodiment of the energy conversion system 10. As discussed above, the front cover 12 may include glass, polycarbonate, or the like. Angle of inclination of the triangular trough ($\theta$) is selected based on refractive index ($n_c$) of the front cover 12, width ($W_c$) of the photovoltaic cell 15, and length ($L_c$) of the photovoltaic cell 15, so as to ensure total internal reflection of light rays for a broad range of light incident angles. In the illustrated embodiment, light captured by the photovoltaic cell 15 may be enhanced by increasing the ratio of height ($h_b$) of the triangular trough to height ($h_c$) of the front cover 12. The width of the triangular trough is indicated by reference variable "$W_b$". The radius of curvature of the triangular trough is indicated by reference variable "r". The triangular troughs may be coated with a metallic coating (e.g. silver coating) for reflecting the incident light rays.

In one example, for 48% cell coverage of the energy conversion system 10, height ($h_c$) of the front cover 12 is equal to 5.6 mm, height ($h_b$) of the triangular trough is equal to 3.6 mm, Width ($W_b$) of the triangular trough is equal to 12.5 mm, length ($L_c$) of the photovoltaic cell is equal to 25 mm, width ($W_c$) of the photovoltaic cell is equal to 25 mm, and angle of inclination of the triangular trough ($\theta$) is equal to 34.5376 degrees.

Figure 8:
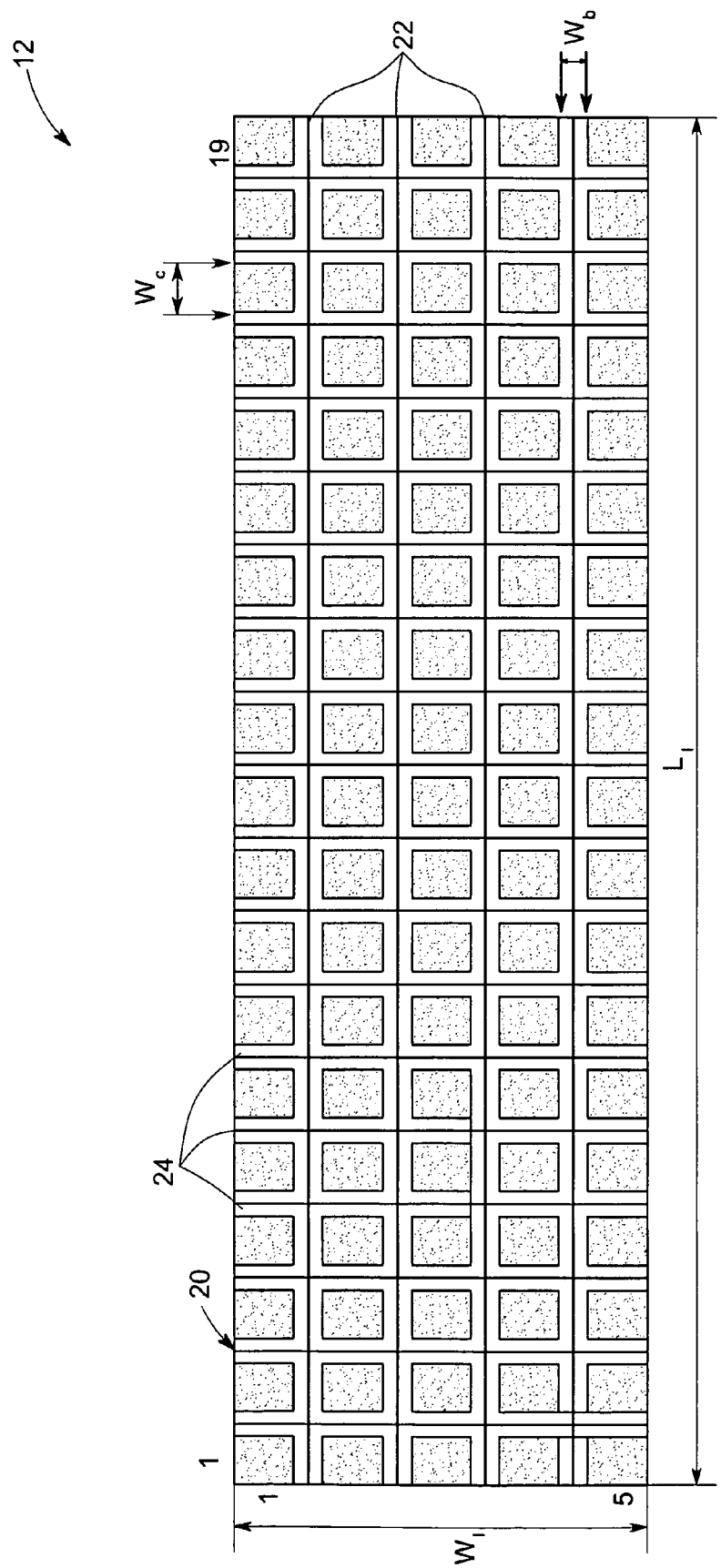
FIG. 8 is a top plan view of a laminate layout of the front optical cover having plurality of crossed triangular troughs in accordance with an exemplary embodiment of the present technique.

FIG. 8 illustrates a top plan view of a laminate layout of the front cover 12 having the patterned second surface 20. In the illustrated embodiment, the patterned second surface 20 includes the plurality of equally spaced horizontal triangular troughs 22 and vertical triangular troughs 24 arranged in 5 rows and 19 columns. The length of the patterned second surface 20 is indicated by reference variable "$L_1$". The width of the patterned second surface 20 is indicated by reference variable "$W_1$". The width of photovoltaic cell is indicated by reference variable "$W_c$". The width of the triangular troughs is indicated by the reference variable "$W_b$". In one example, "$L_1$" is equal to 700 mm, "$W_1$" is equal to 175 mm, "$W_c$" is equal to 25 mm, and "$W_b$" is equal to 12.5 mm.

Figure 9:
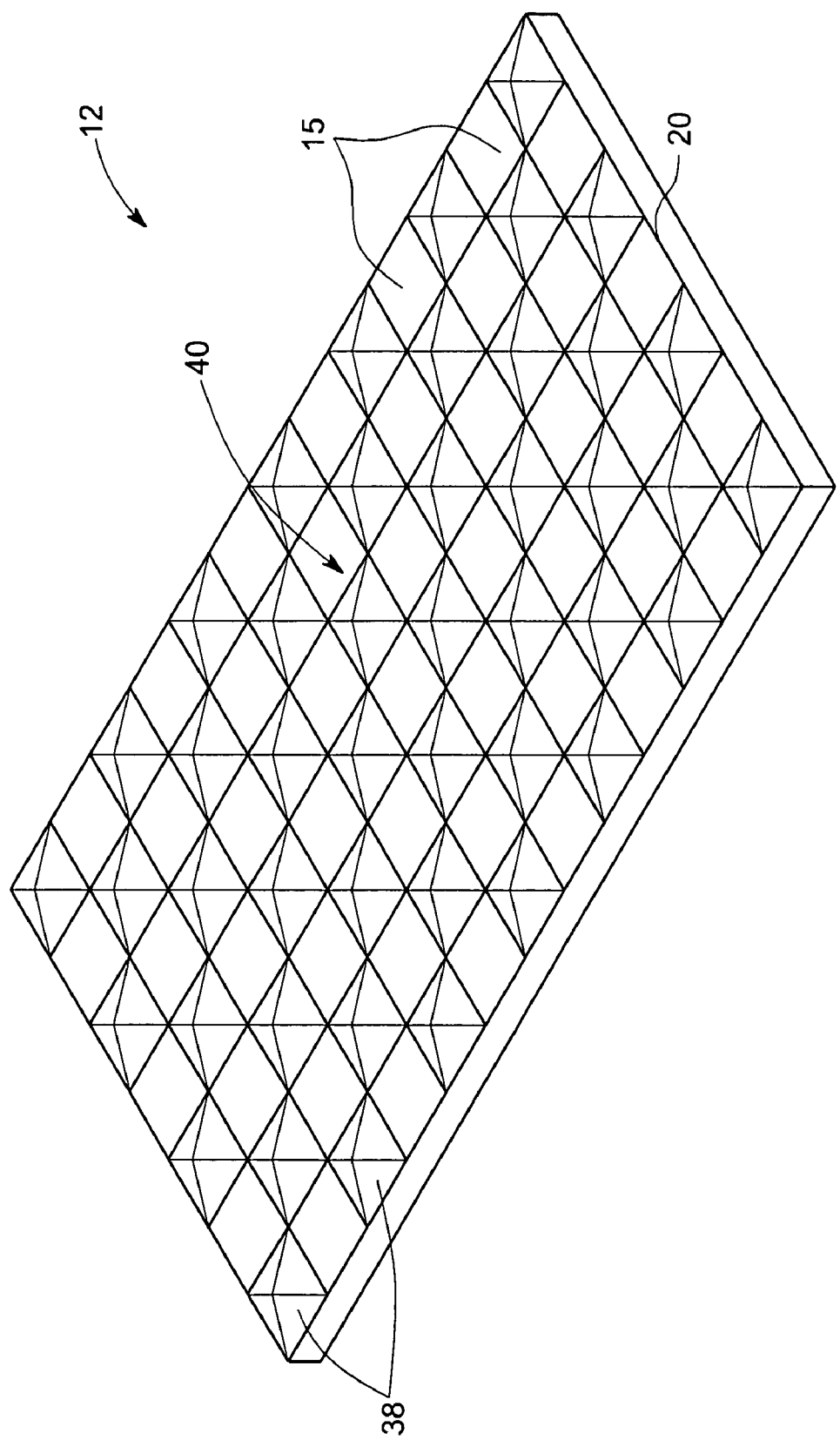
FIG. 9 is a diagrammatical representation of the energy conversion system having a pyramidal matrix in accordance with an exemplary embodiment of the present technique.

FIG. 9 illustrates another embodiment of the front cover 12 having the patterned second surface 20. The patterned second surface 20 includes a plurality of equally spaced pyramidal structures 38 forming a pyramidal matrix 40. The plurality of photovoltaic cells 15 are located between the pyramidal structures 38. As illustrated in the previous embodiment, the light rays incident on the photovoltaic cells 15 are either directly transmitted through the front cover 12 or are reflected from the pyramidal structures 38 (reflected either once or multiple times) and then reflected from the first surface (reflected either once or multiple times as shown above) due to total internal reflection prior to impinging the photovoltaic cells 15. The pyramidal structures 38 are provided to accept a broad range of incident light rays and may be optimized for a broad range of photovoltaic cell sizes. As the optical concentration is low and relatively uniform across the photovoltaic cells 15, performance degradation of the photovoltaic cells 15 due to thermal effect is minimized.

Figure 10:
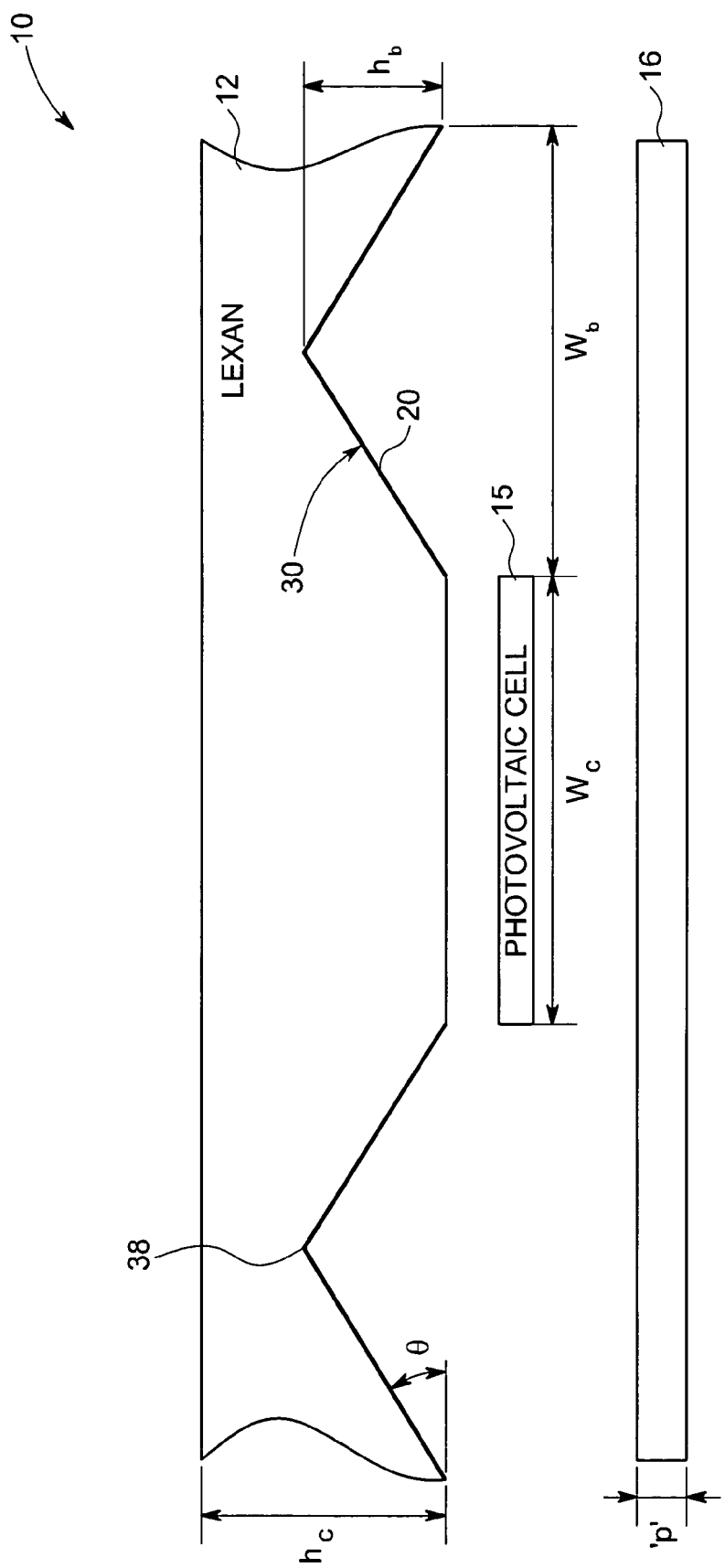
FIG. 10 is a diagrammatical representation of the energy conversion system having the pyramidal matrix in accordance with certain aspects of the present technique.

FIG. 10 illustrates another embodiment of the energy conversion system 10. In the illustrated embodiment, the front cover 12 comprises a Lexan® material. The photovoltaic cell 15 is provided between the patterned second surface 20 of the first cover 20 and the back cover 16. The patterned second surface 20 includes the plurality of pyramidal structures 38 provided with the reflective layer 30. In another example, the patterned second surface 20 includes plurality of equally spaced horizontal triangular troughs and vertical triangular troughs, or pyramidal structures, or conical structures, or a combination thereof.

In the illustrated embodiment, height of the front cover 12 is indicated by reference variable "$h_c$". Height of the pyramidal structure is indicated by reference variable "$h_b$". Angle of inclination of the pyramidal structure indicated by reference variable "$\theta$". Width of the photovoltaic cell indicated by reference variable "$W_c$". Width of the pyramidal structure indicated by reference variable "$W_b$", and thickness of the back cover indicated by reference variable "p". In one example, "$h_c$" is equal to 15.5 mm, "$h_b$" is equal to 13.9 mm, "$\theta$" is equal to 29 degrees, "$W_c$" is equal to 50 mm, "$W_b$" is equal to 50 mm, and "p" is equal to 1.5 mm.

Figure 11:
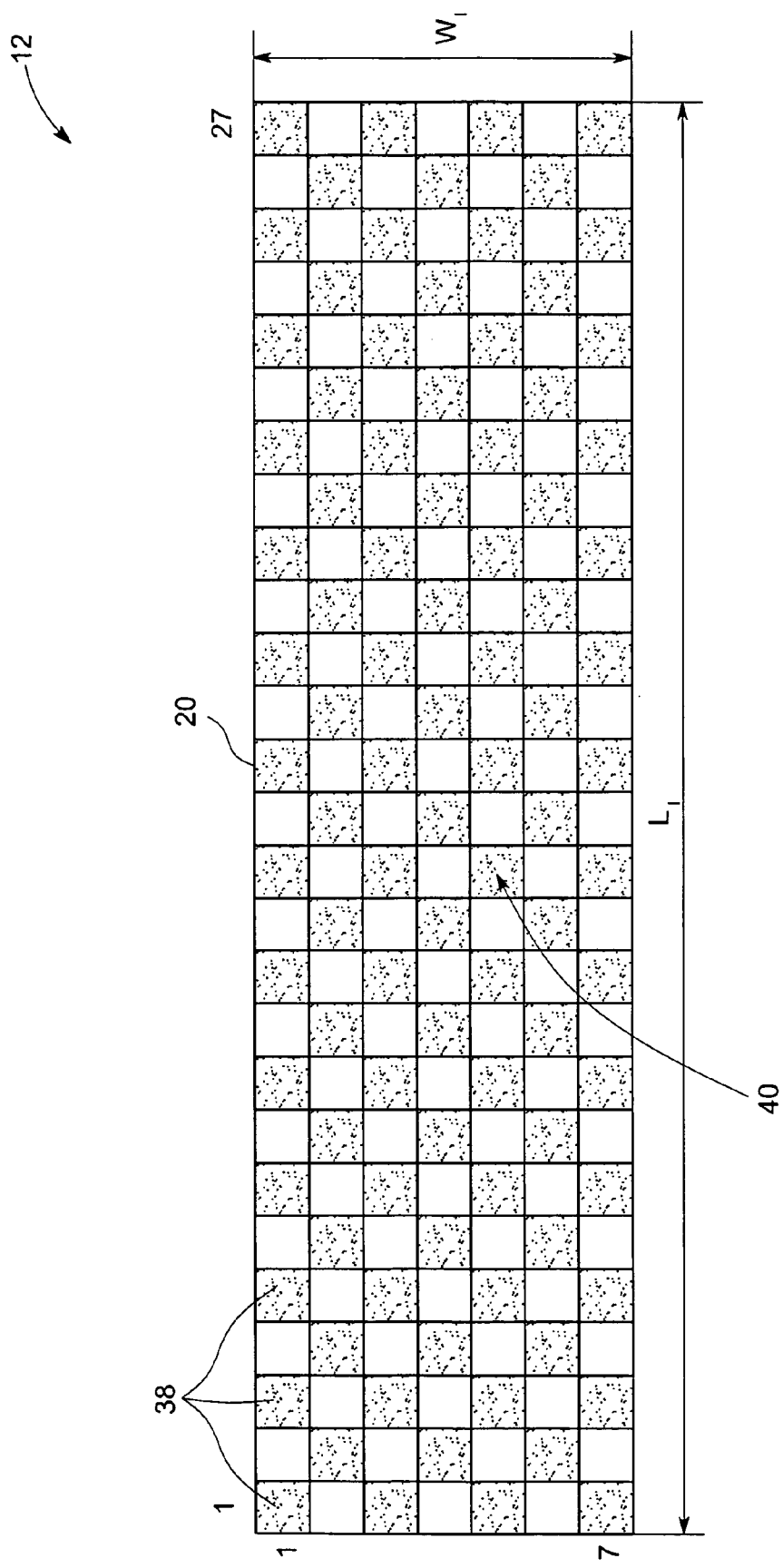
FIG. 11 is a top plan view of a laminate layout of the front optical cover having plurality of pyramidal structures in accordance with an exemplary embodiment of the present technique.

FIG. 11 illustrates a top plan view of another embodiment of a laminate layout of the front cover 12 having the patterned second surface 20. In the illustrated embodiment, the patterned second surface 20 includes the plurality of equally spaced pyramidal structures 38 forming the pyramidal matrix 40 arranged in 7 rows and 27 columns. Length of the patterned second surface 20 is indicated by reference variable "$L_1$" and width of the patterned second surface 20 is indicated by reference variable "$W_1$". In one example, "$L_1$" is equal to 1400 mm, and the "$W_1$" is equal to 350 mm.

Figure 12:
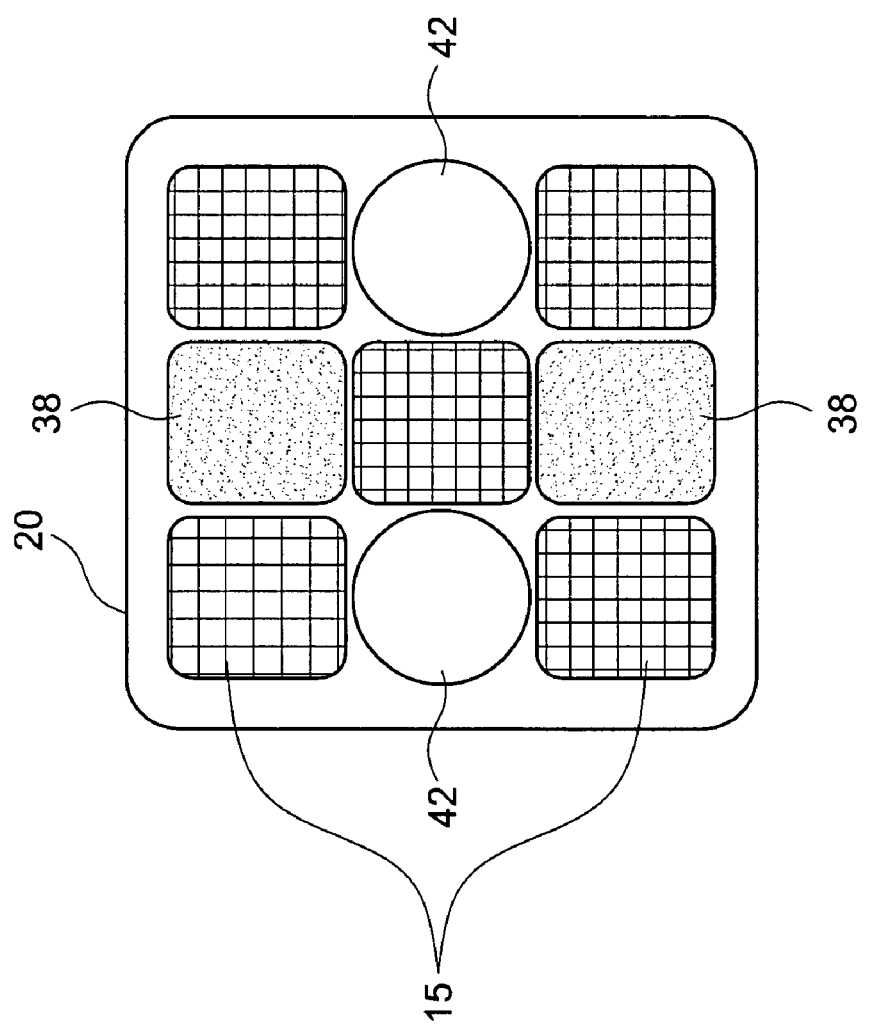
FIG. 12 is a top plan view of a laminate layout of the front optical cover having a plurality of pyramidal and conical structures in accordance with an exemplary embodiment of the present technique.

FIG. 12 illustrates a top plan view of another embodiment of the laminate layout of the front cover having the patterned second surface 20. The patterned second surface 20 includes the plurality of equally spaced pyramidal structures 38 and conical structures 42 forming a matrix. The photovoltaic cells 15 are located between the pyramidal structures 38 and the conical structures 42. The pyramidal structures 38 and the conical structures 42 are provided to accept a broad range of incident light rays and may be optimized for a broad range of photovoltaic cell sizes. In another embodiment, the patterned second surface 20 includes only a plurality of equally spaced conical structures 42 forming a matrix. Residual spaces may be formed between the conical structures 42 and the photovoltaic cells 15. Effect of residual spaces may be mitigated by either using a reflective coating, by forming microstructures provided with the reflective coating in the residual spaces of the front cover, or by using a reflective back layer so as to capture some of the light rays incident on the residual spaces. The front cover 12 illustrated in the above-mentioned embodiments, provide both optical concentration and light guiding functionality. The optical concentration of solar energy on the photovoltaic cell 15 is both low and relatively uniform. As a result degradation in performance of the photovoltaic cells 15 due to thermal effects is reduced.

Figure 13:
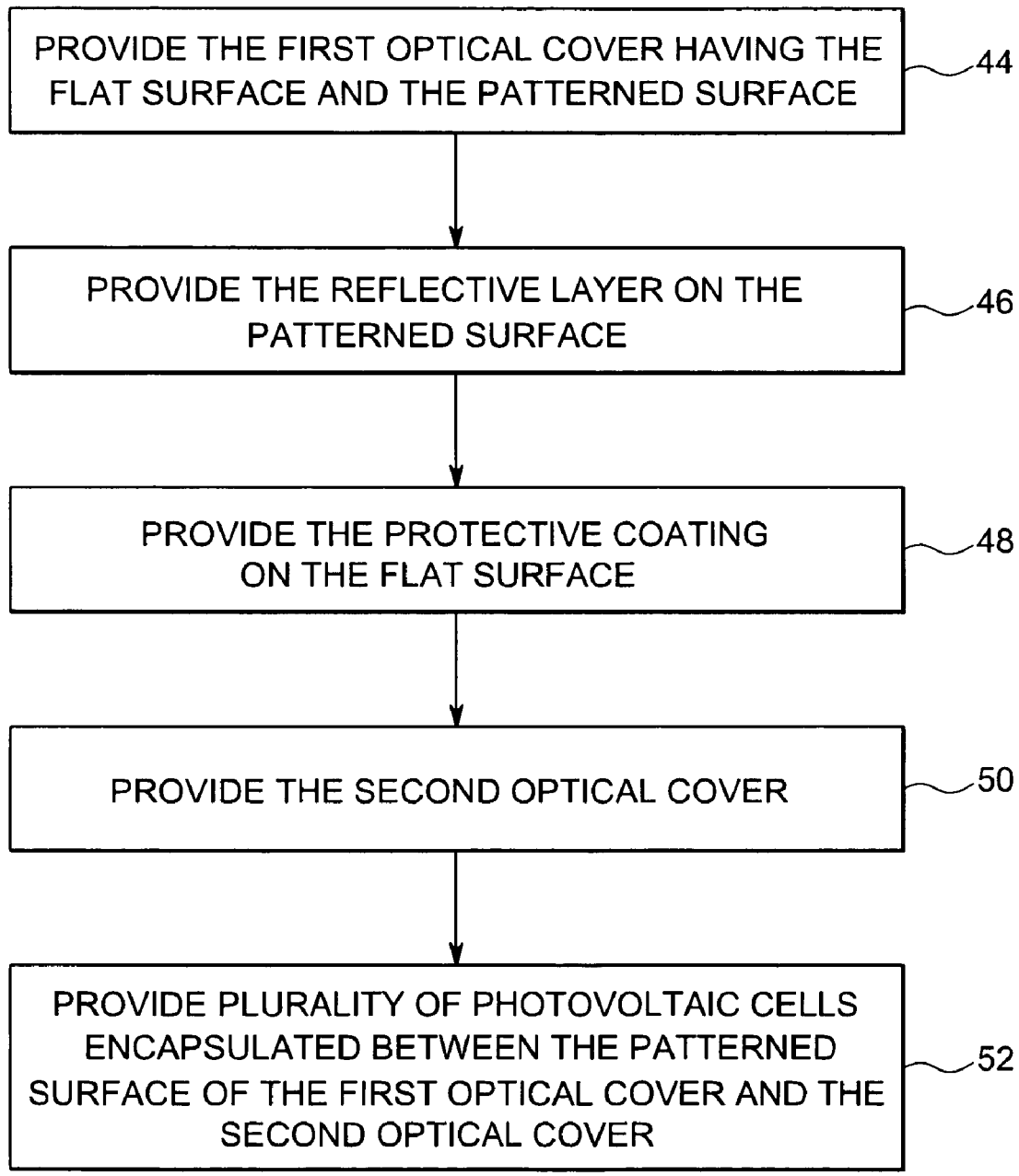
FIG. 13 is a flow chart illustrating a process of manufacturing an energy conversion system in accordance with an exemplary embodiment of the present technique.

Referring to FIG. 13, a flow chart illustrating a method of manufacturing the energy conversion system 10 in accordance with embodiments of the present technique is provided. The method includes providing the first optical cover 12 having the first flat surface 18 and the second patterned surface 20 as represented by step 44. The second patterned surface 20 is configured to concentrate and guide the solar energy. In the one embodiment, the patterned second surface 20 includes plurality of equally spaced horizontal triangular troughs 22 and vertical triangular troughs 24. The horizontal and vertical triangular troughs 22, 24 intersect to form plurality of equally spaced rectangular regions 26. In another embodiment, the patterned second surface 20 includes plurality of equally spaced pyramidal structures 38 forming the pyramidal matrix 40. In another embodiment, the patterned second surface 20 includes plurality of equally spaced conical structures 42 forming the conical matrix. In yet another embodiment, the patterned second surface may include combination of plurality of equally spaced pyramidal structures 38 and conical structures 42. The method may further include providing the reflective layer 30 on the patterned second surface 20 of the first optical cover 12 to reflect incident light rays as represented by step 46.

The method may further include providing the protective coating 29 on the first flat surface 18 of the first optical cover 12 configured to selectively reject ultraviolet light as represented by step 48. The protective coating 29 may be an absorptive coating, dielectric coating or a metallic coating. The method further includes providing the second optical cover 16 as represented by step 50. In one embodiment, the second optical cover 16 comprises a flat plate. In another embodiment, the second optical cover 16 comprises the patterned third surface 32 and the flat fourth surface 34. The method further includes providing the photovoltaic cell layer 14 encapsulated between the second patterned surface 20 and the second optical cover 16 as represented by step 52. The photovoltaic cell layer 14 includes plurality of photovoltaic cells configured to receive the solar energy from the patterned second surface 20 and convert the solar energy into electrical energy.

While only certain features of the invention have been illustrated and described herein, many modifications and changes will occur to those skilled in the art. It is, therefore, to be understood that the appended claims are intended to cover all such modifications and changes as fall within the true spirit of the invention.

The invention claimed is:

1. An energy conversion system, comprising:
   a first optical cover comprising a first surface and a second surface, wherein the first surface comprises a flat surface and the second surface comprises a patterned surface configured to receive solar energy from the first surface and further configured to concentrate and guide the solar energy; wherein the patterned surface comprises a plurality of pyramidal structures, or conical structures, or a combination thereof;
   a second optical cover; and
   a plurality of photovoltaic cells located between the patterned surface of the first optical cover and the second optical cover and configured to receive the solar energy from the patterned surface and convert the solar energy into electrical energy.

2. The system of claim 1, further comprising a reflective layer coated on the patterned surface of the first optical cover.

3. The system of claim 2, wherein the reflective layer comprises a metallic coating.

4. The system of claim 2, wherein the reflective layer comprises a dielectric coating.

5. The system of claim 1, wherein the patterned surface comprises a plurality of equally spaced horizontal and vertical triangular troughs intersecting to form a plurality of equally spaced rectangular regions.

6. The system of claim 1, wherein the patterned surface comprises an equally spaced pyramidal matrix.

7. The system of claim 1, wherein the patterned surface comprises a combination of pyramidal and conical structures.

8. The system of claim 1, wherein the plurality of photovoltaic cells are embedded in a protective encapsulant.

9. The system of claim 1, further comprising a protective coating formed on the flat surface of the first cover to selectively transmit visible light to the plurality of photovoltaic cells.

10. The system of claim 1, wherein solar energy incident on the photovoltaic cells is directly transmitted through the first optical cover, or is transmitted by total internal reflection of the first optical cover, or a combination thereof.

11. A solar concentrator configured to receive solar energy and direct solar energy to a plurality of photovoltaic cells, the solar concentrator comprising:
    a flat surface;
    a patterned surface including a plurality of mutually coupled or discrete pyramidal structures, or conical structures, or a combination thereof; and
    a reflective layer formed on the patterned surface.

12. The solar concentrator of claim 11, wherein the solar concentrator comprises glass.

13. The solar concentrator of claim 11, wherein the solar concentrator comprises polycarbonate.

14. The solar concentrator of claim 11, wherein the patterned surface comprises a plurality of equally spaced horizontal and vertical triangular troughs intersecting to form a plurality of equally spaced rectangular regions.

15. The solar concentrator of claim 11, wherein the patterned surface comprises an equally spaced pyramidal matrix.

16. The solar concentrator of claim 11, wherein the patterned surface comprises a combination of pyramidal and conical structures.

17. An energy conversion system, comprising:
    a first optical cover comprising a first surface and a second surface, wherein the first surface comprises a flat surface and the second surface comprises a patterned surface configured to receive solar energy from the first surface and further configured to concentrate and guide the solar energy; wherein the patterned surface comprises a plurality of equally spaced horizontal and vertical triangular troughs intersecting to form a plurality of equally spaced rectangular regions;
    a second optical cover; and
    a plurality of photovoltaic cells located between the patterned surface of the first optical cover and the second optical cover and configured to receive the solar energy from the patterned surface and convert the solar energy into electrical energy;

wherein an angle of inclination of each of the plurality of triangular troughs is selected based on a refractive index of the first optical cover, width of the photovoltaic cell, and length of the photovoltaic cell.

* * * * *